（12） United States Patent
Mizugaki

(10) Patent No.: US 6,804,161 B2
(45) Date of Patent: Oct. 12, 2004

(54) SEMICONDUCTOR DEVICE, REFRESHING METHOD THEREOF, MEMORY SYSTEM, AND ELECTRONIC INSTRUMENT

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 195 days.

(21) Appl. No.: 10/108,369

(22) Filed: Mar. 29, 2002

(65) Prior Publication Data

US 2002/0159314 A1 Oct. 31, 2002

(30) Foreign Application Priority Data

Apr. 2, 2001 (JP) ........................................ 2001-103416

(51) Int. Cl.$^7$ ................................................ G11C 8/00
(52) U.S. Cl. ........................... 365/230.03; 365/230.03; 365/230.06
(58) Field of Search ................................ 365/149, 222, 365/230.23, 233.05, 230.03, 191, 193

(56) References Cited

U.S. PATENT DOCUMENTS 5,453,959 A * 9/1995 Sakuta et al. ............... 365/222
6,493,281 B2 * 12/2002 Mizugaki .................... 365/222

FOREIGN PATENT DOCUMENTS

| JP | A-62-12990 | 1/1987 |
|----|-----------|--------|
| JP | A-62-42393 | 2/1987 |
| JP | A-62-259295 | 11/1987 |
| JP | A-1-94593 | 4/1989 |
| JP | A-3-16085 | 1/1991 |
| JP | A-4-106782 | 4/1992 |
| JP | A-2000-353382 | 12/2000 |
| JP | A-2002-352576 | 12/2002 |

OTHER PUBLICATIONS

U.S. patent application Ser. No. 09/945,651, Mizugaki, filed Sep. 5, 2001.
U.S. patent application Ser. No. 09/949,672, Mizugaki, filed Sep. 12, 2001.
U.S. patent application Ser. No. 09/971,914, Mizugaki, filed Oct. 9, 2001.
U.S. patent application Ser. No. 09/972,053, Mizugaki, filed Oct. 9, 2001.

* cited by examiner

Primary Examiner—David Nelms
Assistant Examiner—Thinh T Nguyen
(74) Attorney, Agent, or Firm—Oliff & Berridge, PLC

(57) ABSTRACT

The present invention provides a method of refreshing a semiconductor device such as a VSRAM. A memory cell array 20 of a semiconductor device 1 is divided into four blocks, specifically blocks A to D. During a period in which data read or write operations are being performed in one block, refreshing is performed for the remaining blocks. An ATD signal acts as a trigger for a series of operations during the reading or writing of memory cells. In a burst mode, refreshing is based on the ATD signal.

8 Claims, 12 Drawing Sheets

SEMICONDUCTOR DEVICE, REFRESHING METHOD THEREOF, MEMORY SYSTEM, AND ELECTRONIC INSTRUMENT

Japanese Patent Application No. 2001-103416, filed on Apr. 2, 2001, is hereby incorporated by reference in its entirety.

BACKGROUND OF THE INVENTION

The present invention relates to a semiconductor device which retains data by refreshing, a method of refreshing this semiconductor device, a memory system, and an electronic instrument.

A virtually static RAM (VSRAM) is one type of semiconductor memory. Although memory cells of a VSRAM are the same as memory cells of a DRAM, the VSRAM does not need multiplexing of the column and row addresses. Moreover, the user can use the VSRAM without taking refreshing into consideration (transparency of refreshing).

BRIEF SUMMARY OF THE INVENTION

The present invention may provide a semiconductor device which retains data by refreshing, a method of refreshing this semiconductor device, a memory system, and an electronic instrument.

(1) A method of refreshing a semiconductor device in accordance with one aspect of the present invention relates to a method of refreshing a semiconductor device having a memory cell array divided into a plurality of blocks, the method comprising:

an external access step of reading or writing data continuously with respect to a block selected from the plurality of blocks, by generating a plurality of addresses continuously by a pulse signal, based on one address specified by an address signal;

a detection signal generation step of generating a detection signal having a period longer than the pulse signal and detecting a change in the address signal; and a refreshing step of refreshing blocks in the plurality of blocks other than the selected block, based on the detection signal.

The external access step refers to the generation of a plurality of sequential addresses, such as first to fourth addresses, based on a specification by a first address, and the execution of continuous data read or write with respect to the memory cells of those addresses. The external access step entails an extreme shortening of the period of the pulse signal, because of reading or writing data at high speed, and a shortening of the period in which refreshing is done. For that reason, if references to the external access and refreshing are set on this pulse signal, it could happen that a block to be externally accessed is being refreshed, delaying the external access. This aspect of the present invention makes it possible to perform external access and refreshing with reference to the above-described detection signal that has a period longer than that of the pulse signal, thus preventing any delay in external access.

This aspect of the present invention also makes it possible to refresh the other blocks while the block selected by address is being externally accessed, enabling efficient operation of the semiconductor device.

The generation of a plurality of addresses by the pulse signal, based on one address specified by the address signals, refers to the generation of a plurality of column addresses in sequence by the clock signal, based on one column address, by way of example. In this case, the row address is the same.

The detection signal contains an address transition detector (ATD) signal, by way of example.

The pulse signal contains a clock signal or a signal that is multiplied from the clock signal within the semiconductor device, by way of example.

An address signal that is input from the outside to the semiconductor device could be used unchanged as the address signal, by way of example. In addition, the address signal from the outside could be converted into a block address signal, a column address signal, and a row address signal, where those signals could be used as an address signal.

The number of blocks selected by address for external access could be one or more. The number of blocks that are to be accessed externally can be arbitrarily determined depending on the design of the semiconductor device.

Refreshing with respect to a block means the refreshing of memory cells in a certain row in a block. A "row" could be one row or it could be a plurality of rows. This can be determined arbitrarily, based on the design of the semiconductor device.

External access means a read of data from a memory cell or a write of data thereto, by way of example.

(2) In this method of refreshing a semiconductor device, the refreshing step may comprise:

a refresh request step of generating a refresh request with respect to each of the plurality of blocks, based on the detection signal; and a refresh execution step of refreshing blocks in the plurality of blocks other than the selected block, based on the refresh request.

(3) In this method of refreshing a semiconductor device, the refresh execution step may end in a period between the generation of the detection signal and the generation of the next detection signal.

This ensures that when an attempt is made to access a certain block externally, that block is not being refreshed and thus external access is not delayed.

A semiconductor device in accordance with another aspect of the present invention comprises:

a memory cell array divided into a plurality of blocks;

a pulse signal generation circuit which generates a pulse signal;

a detection signal circuit which generates a detection signal having a period longer than the pulse signal and detecting a change in an address signal;

an address generation circuit which generates a plurality of addresses sequentially by the pulse signal, based on the one address specified by the address signal, so as to perform continuous reading or writing of data with respect to a block selected from the plurality of blocks; and a refresh circuit which refreshes blocks in the plurality of blocks other than the selected block, based on the detection signal.

This aspect of the present invention is similar to that described in (1).

(5) In this semiconductor device, the address generation circuit may comprise a column address generation circuit to which a column address signal out of the address signal is input, and which generates a plurality of column addresses by the pulse signal, based on the column address signal.

(6) In this semiconductor device, the refresh circuit may comprise:

a plurality of refresh request signal generation circuits each provided corresponding to each of the plurality of blocks, which generate refresh request signals with respect to the plurality of blocks, based on the detection signal; and a plurality of block controllers each provided corresponding to each of the plurality of blocks, wherein one of the plurality of block controllers, which corresponds to the selected block, may generate an external access execution signal with respect to the selected block; and wherein remaining block controllers, which correspond to the blocks other than the selected block, may generate refresh execution signals based on the refresh request signals.

(7) A memory system in accordance with further aspect of the present invention may comprise any of the semiconductor devices described in (4) to (6) above.

(8) An electronic instrument in accordance with still another aspect of the present invention may comprise the memory system described in (7) above.

DETAILED DESCRIPTION OF THE EMBODIMENT

Embodiments of the present invention are described below with reference to the accompanying drawings. This embodiment illustrates an example in which the present invention is applied to a VSRAM.

Structure of Semiconductor Device

Figure 1:
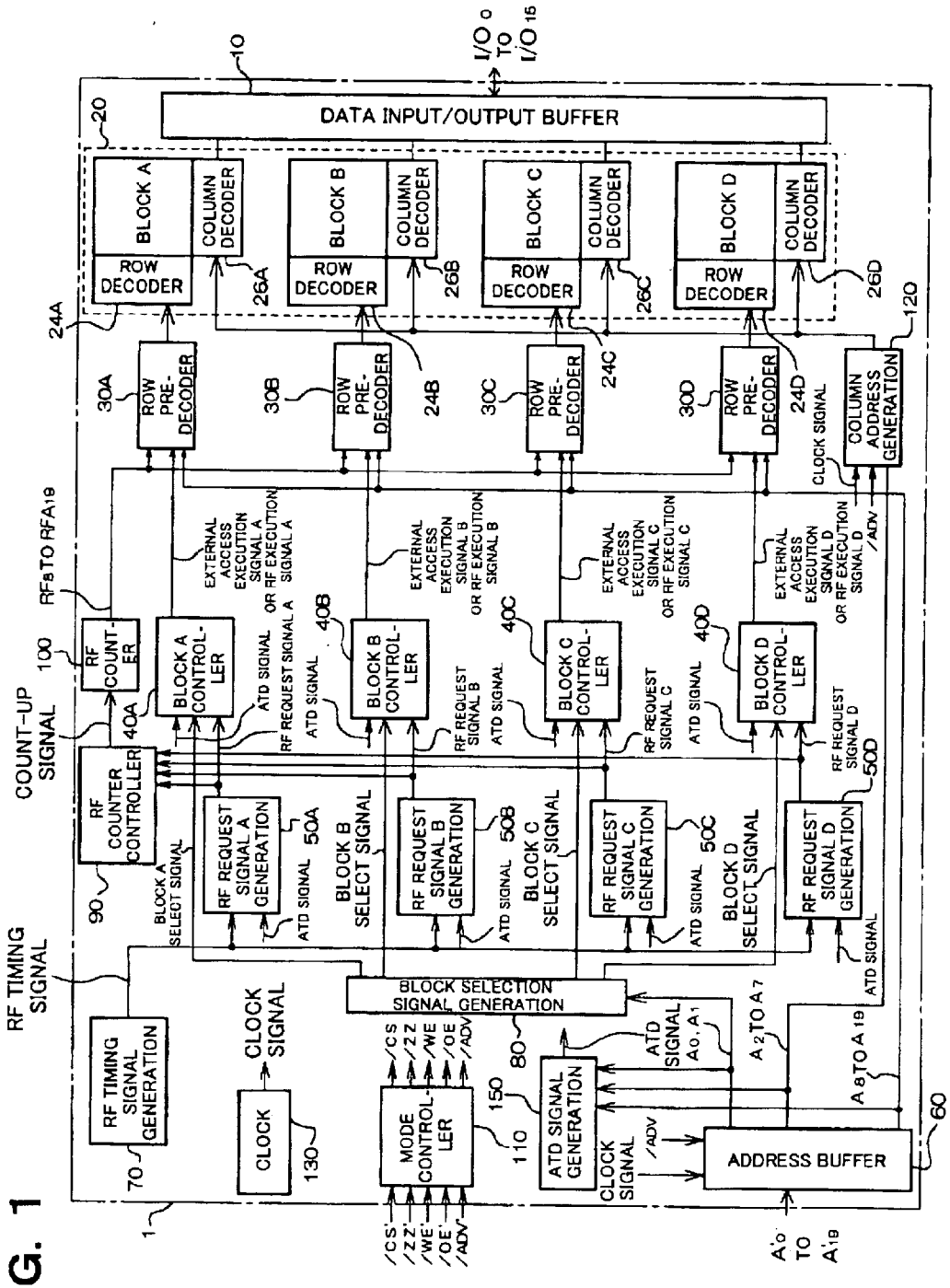
FIG. 1 is a circuit block diagram of a semiconductor device in accordance with an embodiment of the present invention.

The description first concerns the structure of this embodiment. A circuit block diagram of a semiconductor device 1 in accordance with this embodiment is shown in FIG. 1. Each block is described below.

(A) 16-bit data ($I/O_0$ to $I/O_{15}$) is input to or output from a data input/output buffer 10.

(B) A memory cell array 20 includes a plurality of memory cells arranged in an array. Each memory cell includes an access transistor, which is an n-type MOS transistor, and a capacitor for holding data. The memory cell array 20 is divided into four blocks: a block A, a block B, a block C, and a block D. If the memory cell array 20 has a capacity of 16 Mbits, by way of example, each block has a capacity of 4 Mbits. Note that the memory cell array 20 of the present invention is divided into at least two blocks/The number of blocks may be either odd or even.

Each block includes a plurality of word lines, a plurality of pairs of bit lines intersecting these word lines, and the memory cells provided corresponding to the intersections between the word lines and the pairs of bit lines. The word lines correspond to the memory cells in each row of the blocks. Specifically, the memory cells in a row corresponding to a specific word line are selected by selecting that specific word line.

The blocks A to D include row decoders 24A to 24D and column decoders 26A to 26D. The above word lines are selected by the row decoders. The above bit line pairs are selected by the column decoders.

(C) Address signals $A'_0$ to $A'_{19}$ for performing external access (such as reading or writing) are input to an address buffer 60 from the outside. The address signals $A'_0$ and $A'_1$ are assigned to block address signals $A_0$ and $A_1$. Specifically, the least significant address signal $A'_0$ is assigned to the block address signal $A_0$. The next least significant address signal $A'_1$ is assigned to the block address signal $A_1$. One of the blocks A to D containing a memory cell to be accessed externally is selected based on the block address signals $A_0$ and $A_1$.

The address signals $A'_2$ to $A'_7$ are assigned to column address signals $A_2$ to $A_7$. The column address signals $A_2$ to $A_7$ are input to the column decoders 26A to 26D through a column address generation circuit 120. The column addresses of the blocks A to D are selected based on the column address signals $A_2$ to $A_7$.

The address signals $A'_8$ to $A'_{19}$ are assigned to row address signals $A_8$ to $A_{19}$. The row address signals $A_8$ to $A_{19}$ are assigned to row predecoders 30A to 30D, as described later. The row addresses of the blocks A to D are selected based on the row address signals $A_8$ to $A_{19}$. Note that the address signals $A'_0$ to $A'_{19}$ are assigned in the order of block address signals, column address signals, and row address signals, but the order may be made to differ therefrom.

(D) The block address signals $A_0$ and $A_1$, column address signals $A_2$ to $A_7$, and the row address signals $A_8$ to $A_{19}$ that are output from the address buffer 60 are input to an address transition detector (ATD) signal generation circuit 150. The ATD signal generation circuit 150 is a circuit that generates a pulse-form ATD signal every time the signals $A_0$ to $A_{19}$ change. The ATD signal is not generated while the address signal has specified an address. The ATD signal acts as a trigger for a series of operations during external access (such as reading or writing) to memory cells, specifically control over word line selection, bit line pair selection, or data read or write. Note that the ATD signal generation circuit 150 is described in detail in the section: "ATD Signal Generation Circuit".

(E) The column address generation circuit 120 is used for burst mode. The column address signals $A_2$ to $A_7$ from the address buffer 60, an/ADV from a mode controller 110, and a clock signal from the clock 130 are input to the column address generation circuit 120. Burst mode is processing whereby, if a certain address is specified by signals (block address signals, column address signals, or row address signals) $A_0$ to $A_{19}$, data is read from or written to a predetermined number of sequential addresses starting from that address, by simply repeating incrementation of the column addresses within the semiconductor device 1 in a state in which the row address is fixed, with reference to the clock signal. The data read or write can be speeded up by shortening the period of the clock signal. The column address generation circuit 120 includes a burst address counter. Column addresses are generated continuously by repeatedly incrementing the column address by a clock signal, based on a column address signal that has been input to the burst address counter. Note that the bust mode is described in the section: "Burst mode".

(F) The semiconductor device 1 is provided with a clock 130. A clock signal that is output from the clock 130 acts as a reference signal during the continuous generation of column addresses in burst mode. One feature of this embodiment is the way in which refreshing is not based on this clock signal but on the above-described ATD signal. This is described in detail in the section: "Refresh Operation of Semiconductor Device".

(G) The semiconductor device 1 includes the mode controller 110. An operating state and a standby state will be described before the mode controller 110 is described. The semiconductor device 1 has an operating state and a standby state. External access is possible during the operating state. External access is not possible during the standby state. Refreshing is performed even in the standby state.

The standby state consists of a non-selected state and a power-saving state. The non-selected state is a state in which the semiconductor device 1 is not selected by a chip select signal/CS, although the system comprising the semiconductor device 1 is in operation, for example. The power-saving state is a state in which the system comprising the semiconductor device 1 is on standby.

A chip select signal/CS', a snooze signal/ZZ', a write enable signal/WE', an output enable signal/OE', and an address varied signal/ADV' are input to the mode controller 110 from the outside. The chip select signal/CS, a snooze signal/ZZ, a write enable signal/WE, an output enable signal/OE, and the address varied signal/ADV are output from the mode controller 110.

The semiconductor device 1 is in the operating state when the chip select signal/CS is at L level and the snooze signal/ZZ is at H level. It is in the non-selected state when the chip select signal/CS is at H level and the snooze signal/ZZ is also at H-level. It is in the power-saving state when the chip select signal/CS is at H level and the snooze signal/ZZ is at L level. In the power-saving state, the current consumption of the semiconductor device 1 is at a minimum.

The address varied signal/ADV' sets a condition for the start of burst mode. When the address varied signal/ADV is at L level in this embodiment, the address signals $A'_0$ to $A'_{19}$ are fetched into the semiconductor device from the outside in synchronization with the rise of the clock signal and data is output by the fourth cycle of the clock signal.

(H) The block address signals $A_0$ and $A_1$ are input to a block select signal generation circuit 80. Block A to D select signals are output from the block select signal generation circuit 80.

When the block address signals ($A_0$ and $A_1$) are (L level, L level), the outputs from the block selection signal generation circuit 80 are the block A select signal at H level (active) and the block B, C, and D select signals at L level. The block A is selected based on the block A select signal at H level.

When the block address signals ($A_0$ and $A_1$) are (H level, L level), the outputs from the block selection signal generation circuit 80 are the block B select signal at H level (active) and the block A, C, and D select signals at L level. The block B is selected based on the block B select signal at H level.

When the block address signals ($A_0$ and $A_1$) are (L level, H level), the outputs from the block selection signal generation circuit 80 are the block C select signal at H level (active) and the block A, B, and D select signals at L level. The block C is selected based on the block C select signal at H level.

When the block address signals ($A_0$ and $A_1$) are (H level, H level), the outputs from the block selection signal generation circuit 80 are the block D select signal at H level (active) and the block A, B, and C select signals at L level. The block D is selected based on the block D select signal at H level. Note that the block selection signal generation circuit 80 is described in detail in the section: "Block Select Signal Generation Circuit".

(I) A refresh (RF) timing signal generation circuit 70 comprises a ring oscillation circuit and generates a refresh (RF) timing signal. The RF timing signal generation circuit 70 periodically sets the RF timing signal to H level (active). Refresh (RF) request signals A to D go to H level (active) based on the rise of the RF timing signal to H level.

(J) An RF request signal A generation circuit 50A to an RF request signal D generation circuit 50D are provided corresponding to the blocks A to D, to which is input the RF timing signal from the RF timing signal generation circuit 70. RF request signals A to D are output from the respective RF request signal A generation circuit 50A to the RF request signal D generation circuit 50D. Note that the RF request signal A generation circuit 50A to the RF request signal D generation circuit 50D are described in detail in the section: "RF request signal generation circuits".

(K) A block A controller 40A to a block D controller 40D are provided corresponding to the blocks A to D. The RF request signals A to D and block A to D select signals are input to the corresponding block A controller 40A to block D controller 40D.

The block A controller 40A to the block D controller 40D control the execution of either external access or refreshing in the corresponding blocks A to D. Specifically, the RF request signals A to D are input at H level (active) to the corresponding blocks A to D at a certain timing. The one of the block controllers to which the active (H level) block select signal is input (block A controller 40A, for example) outputs an external access execution signal A at H-level (active). External access to the memory cell in the block corresponding to the above block controller (block A, in this example) is based on this external access execution signal.

Since block select signals are input at L level (non-active) to all the remaining block controllers (the block B controller 40B, the block C controller 40C, and the block D controller 40D in this example), refresh execution signals are output at H-level (active) from those block controllers. The refreshing of memory cells in a specific row in the blocks corresponding to the remaining block controllers (block B, block C, and block D in this example) is based on these refresh execution signals. Note that the block controllers are described in the section: "Block Controllers".

(L) The RF request signals A to D that are output from the RF request signal A generation circuit 50A to the RF request signal D generation circuit 50D are input to an RF counter controller 90. The RF counter controller 90 outputs a count-up signal. This count-up signal is input to an RF counter 100. Note that the RF counter controller 90 is described in detail in the section: "RF Counter Controller".

(M) The RF counter 100 has the same structure as that of a conventional counter. Refresh address signals $RFA_8$ to $RFA_{19}$ are output from the RF counter 100. The refresh address signals $RFA_8$ to $RFA_{19}$ are input to the row predecoders 30A to 30D. A plurality of memory cells in a row which must be refreshed is selected in the blocks A to D, based on the refresh address signals $RFA_8$ to $RFA_{19}$.

(N) The row predecoders 30A to 30D supply signals for driving word lines to the corresponding row decoders 24A to 24D, with the operation thereof being described below. The refresh address signals $RFA_8$ to $RFA_{19}$ from the RF counter 100 and the row address signals $A_8$ to $A_{19}$ from the address buffer 60 are input to the row predecoders 30A to 30D. When the block A is to be accessed externally, for example, the external access execution signal A at H level (active) is input to the row predecoder 30A and the RF execution signals B, C, and D at H level (active) are input to the corresponding row predecoders 30B to 30D. This causes the row predecoder 30A to supply to the row decoder 24A a signal for driving the word line that selects the memory cell to be selected externally. The row predecoders 30B to 30D, on the other hand, supply the corresponding row decoders 24B to 24D with signals for driving the word line that selects the memory cells in the row to be refreshed. Note that the row predecoders 30A to 30D are described in detail in the section: "Row Predecoders".

Refresh Operation of Semiconductor Device

Figure 2:
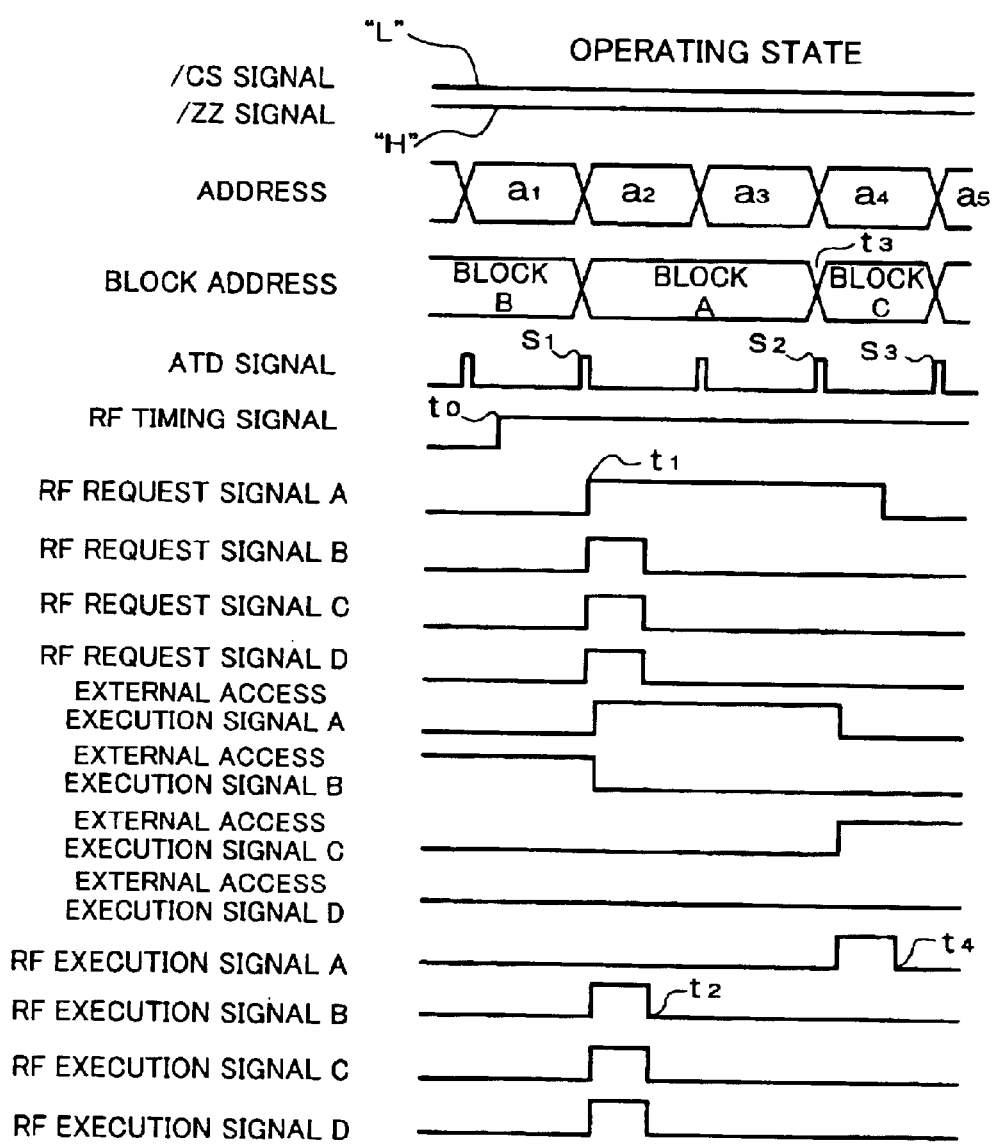
FIG. 2 is a timing chart illustrating an operating state of the semiconductor device in accordance with this embodiment of the present invention.

An example of the refresh operation of the semiconductor device 1 in the operating state is described below with reference to FIGS. 1 and 2. FIG. 2 is a timing chart illustrating the operating state of the semiconductor device 1. The semiconductor device 1 is in the operating state because the chip select signal/CS is at L level and also the snooze signal/ZZ is at H level.

An address is the address of a memory cell to be accessed externally. The address is specified by the block address signals $A_0$ and $A_1$, the column address signals $A_2$ to $A_7$, and the row address signals $A_8$ to $A_{19}$. Every time the address changes, the ATD signal generation circuit 150 generates the pulse-form ATD signal.

A block address is the address of a block to be selected (that is, the block that possesses the memory cell to be externally accessed). Assume that address $a_1$ is in block B, addresses $a_2$ and $a_3$ are in block A, and address $a_4$ is in block C, by way of example.

At a time to, the RF timing signal goes to H level (active). The RF request signals A to D subsequently go to H level (active), based on the initial ATD signal ($s_1$) (time $t_1$). This mechanism is described in detail in the section: "RF Request Signal Generation Circuit".

The block A is selected at time $t_1$. The external access execution signal A is output at H level from the block A controller 40A, based on the ATD signal ($s_1$) and the selection of the block A. The RF execution signals B, C, and D are output from the remaining block controllers, based on the ATD signal ($s_1$) and the RF request signals B, C, and D. This mechanism is described in detail in the section: "Block Controllers".

After time $t_1$, the memory cell that is to be accessed externally (this memory cell is located in the block A) is accessed externally by the external access execution signal A. In this embodiment, external access is performed in burst mode. In the remaining blocks, the memory cells in the row that is to be refreshed (such as then-throw) are refreshed by the RF execution signals B, C, and D. This mechanism is described in detail in the section: "Row Predecoders".

After the period of time needed for refreshing has elapsed, the RF request signals B, C, and D go to L level (non-active) This causes the RF execution signals B, C, and D to go to L level (non-active), and refreshing is completed (time $t_2$). This mechanism is described in detail in the section: "Block Controllers".

Refreshing of the n-th row memory cells that must be refreshed is delayed during the period in which the block address selects the block A. When the block address is changed from the block A to another block, the n-th row memory cells that must be refreshed in the block A are refreshed. This is described below in detail. The block address is changed from the block A to the block C at a time $t_3$ (generation of an ATD signal ($s_2$)). Since the RF request signal A is at H level (active), the RF execution signal A is output at H level from the block A controller 40A, based on the ATD signal ($s_2$) and the RF request signal A at H level. This causes refreshing of the memory cells in the same row in the block A as the row (n-th) row that was refreshed in the other blocks during the period in which the block A was selected. After the period of time needed for refreshing has elapsed, the RF request signal A goes to L level. This causes the RF execution signal A to go to L level, completing the refreshing (time $t_4$).

This completes the refreshing of the memory cells selected by the word lines in the n-th row of the blocks A to D in the operating state.

Note that "word lines in N-th row of blocks A to D" has are two meanings as described below, either of which maybe applied to this embodiment. Word lines according to the first meaning are located at the same geometrical position in the blocks A to D. Word lines according to the second meaning are located in the same row in the address space in the blocks A to D, specifically the same row with respect to the block controllers. Under the second meaning, the geometrical positions of the word lines in the n-th row of the blocks A to D are not necessarily the same.

The refreshing operation of the semiconductor device 1 is as described above. In this embodiment, a refresh-enabled period is the period from the rise of one refresh request signal to the rise of the next refresh request signal and refreshing is performed within the refresh-enabled period (see FIG. 10). During there fresh-enabled period of this embodiment, refreshing is performed on memory cells selected by the word line in the n-th row of the blocks A to D, then refreshing is performed on memory cells selected by the word line of the (n+1) th row of the blocks A to D in the next refresh-enabled period. When refreshing has been performed on the memory cells selected by the word line of the last row (the 4095th row in this embodiment), the refreshing process returns to the memory cells selected by the word line of the first row (0th row). The above series of operations is repeated.

The main effects of this embodiment are described below. As shown in FIG. 2, during external access to a certain block (such as block A) in the operating state, the memory cells to be refreshed in all the remaining blocks other than that block (such as blocks B, C, and D) are refreshed, so that the semiconductor device 1 can be made to operate more efficiently.

In a block in which refreshing has started (block A in FIG. 2) during the period from one ATD signal to the next ATD signal (for example, the period from the generation of the ATD signal $s_2$ to the generation of the ATD signal $s_3$ in FIG. 2), the refreshing of memory cells in the row to be refreshed is completed within that period. For that reason, there is no refreshing of memory cells to be externally accessed until the end of the period in which the addresses of memory cells to be externally accessed have been selected (the $a_4$ selection period in FIG. 2) and the start of the period in which the addresses of the next memory cells to be externally accessed have been selected (the $a_5$ selection period in FIG. 2), so external access is not delayed. Note that, in order to achieve this effect, the period of the address signals $A'_0$ to $A'_{19}$ from the outside (for example, 50 ns to 100 ns) could be made longer than the period during which the refresh execution signal is at H level (for example, 20 ns to 40 ns). In other words, the period from the start of refreshing to the end thereof is substantially the same as the period during which the refresh execution signal is at H level. The address signals from the outside are input to the semiconductor device 1 in a predetermined cycle. If the address signals do not change (specifically, if an address signal in one cycle is the same as the address signal in the next cycle) the address does not change and the ATD signal is not generated. In this manner, the ATD signal is dependent on the period of the address signals from the outside, so that the period of the address signals from the outside could be made longer than the period in which the refresh execution signal is generated.

With this embodiment, the selection of blocks A to D is done with the block address signals $A_0$ and $A_1$. Specifically, the lower end of the address signals $A'_0$ to $A'_{19}$ from the outside is assigned to block address signals. Since the lower down the address signals, the more frequently they change, the blocks to be externally accessed are likely to constantly changing. If block address signals are assigned in this manner, therefore, it is possible to prevent continuous postponement of refreshing in certain blocks. This makes it possible to increase the reliability of refreshing of all the blocks.

Burst Mode

Figure 3:
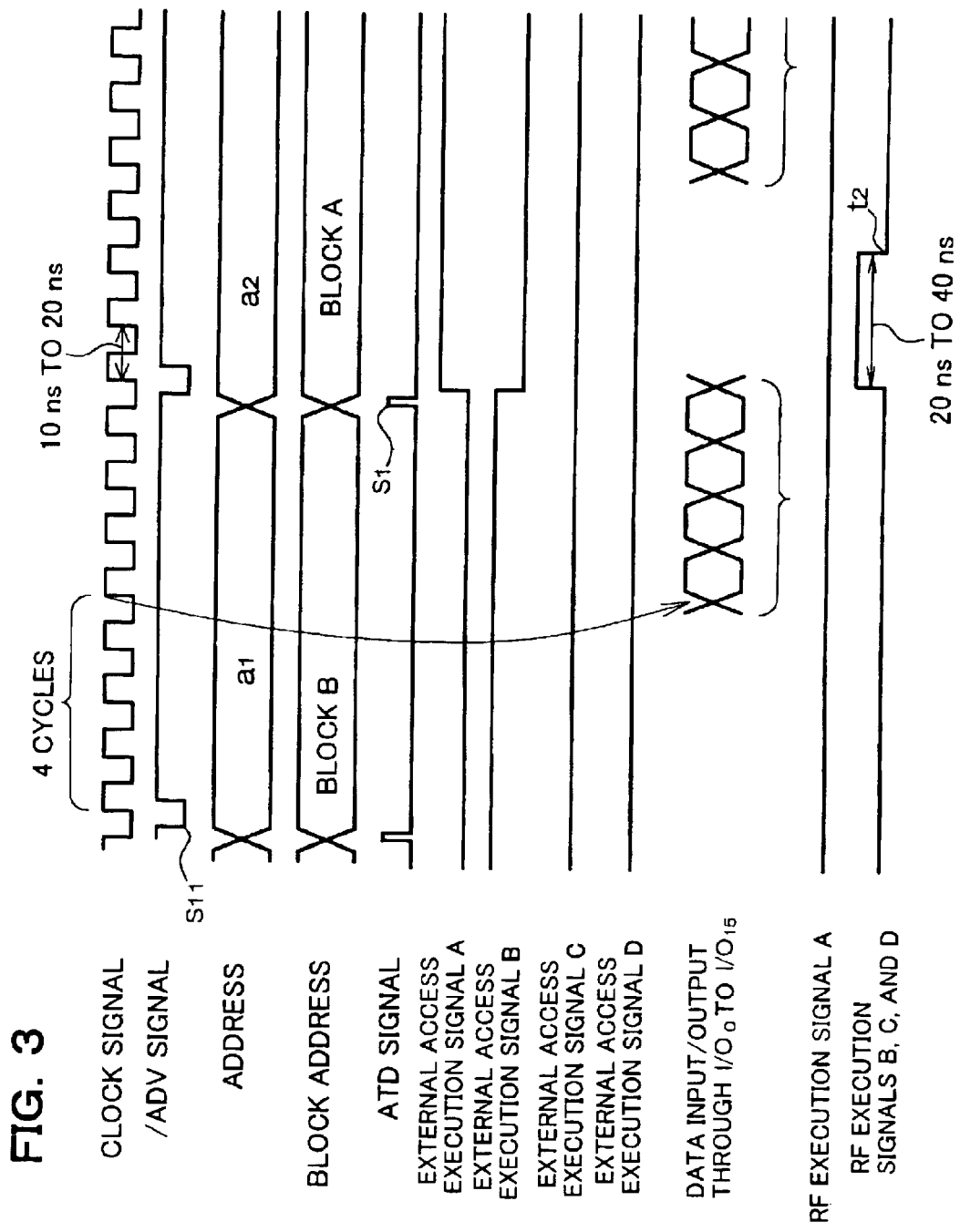
FIG. 3 is a timing chart illustrating burst mode in the semiconductor device in accordance with this embodiment of the present invention.

With this embodiment, external access is performed in burst mode, enabling the reading or writing of data with respect to a predetermined number of sequential addresses (four in this embodiment), based on the specification of one address by an address signal. This is described with reference to FIG. 3. FIG. 3 is a timing chart illustrating burst mode in accordance with this embodiment, showing the period before and after the generation of the ATD signal $s_1$ of FIG. 2.

The description concerns the period in which the address $a_1$ is specified, by way of example. When the address varied signal/ADV is at L level ($s_{11}$), the address signals $A'_0$ to $A'_{19}$ are fetched into the semiconductor device through the address buffer 60 in synchronization with the rise of the clock signal. The column address signals $A_2$ to $A_7$ of the address signals, which specify the address $a_1$, are input to the burst address counter of the column address generation circuit 120. Four column addressed are generated sequentially by four cycles of the clock signal, based on these column address signals. The fourth cycle of the clock signal causes the input or output of the data at the four addresses in sequence, through $I/O_0$ to $I/O_{15}$. These four addresses start at the address $a_1$ and are sequential. These four addresses have a common row address so are selected by the same word line.

In burst mode, data can be read from or written to sequential addresses at high speed, by shortening the period of the clock signal. The period of the clock signal could be 10 ns to 20 ns, by way of example. This also shortens the period during which the refresh execution signal is at H level, which is the period from the start of refresh to the end thereof. For that reason, if the external access execution signal and the RF execution signal are synchronized with reference to this clock signal, it could happen that an attempt is made to externally access a certain address at which refresh is in progress. If that happens, external access to that address is delayed. This problem does not occur with this embodiment since the external access execution signal and the RF execution signal are not synchronized with reference to this clock signal but to the ATD signal.

Note that the burst length is described as being four with this embodiment but it could equally well be eight or a full page (64).

ATD Signal Generation Circuit

Figure 4:
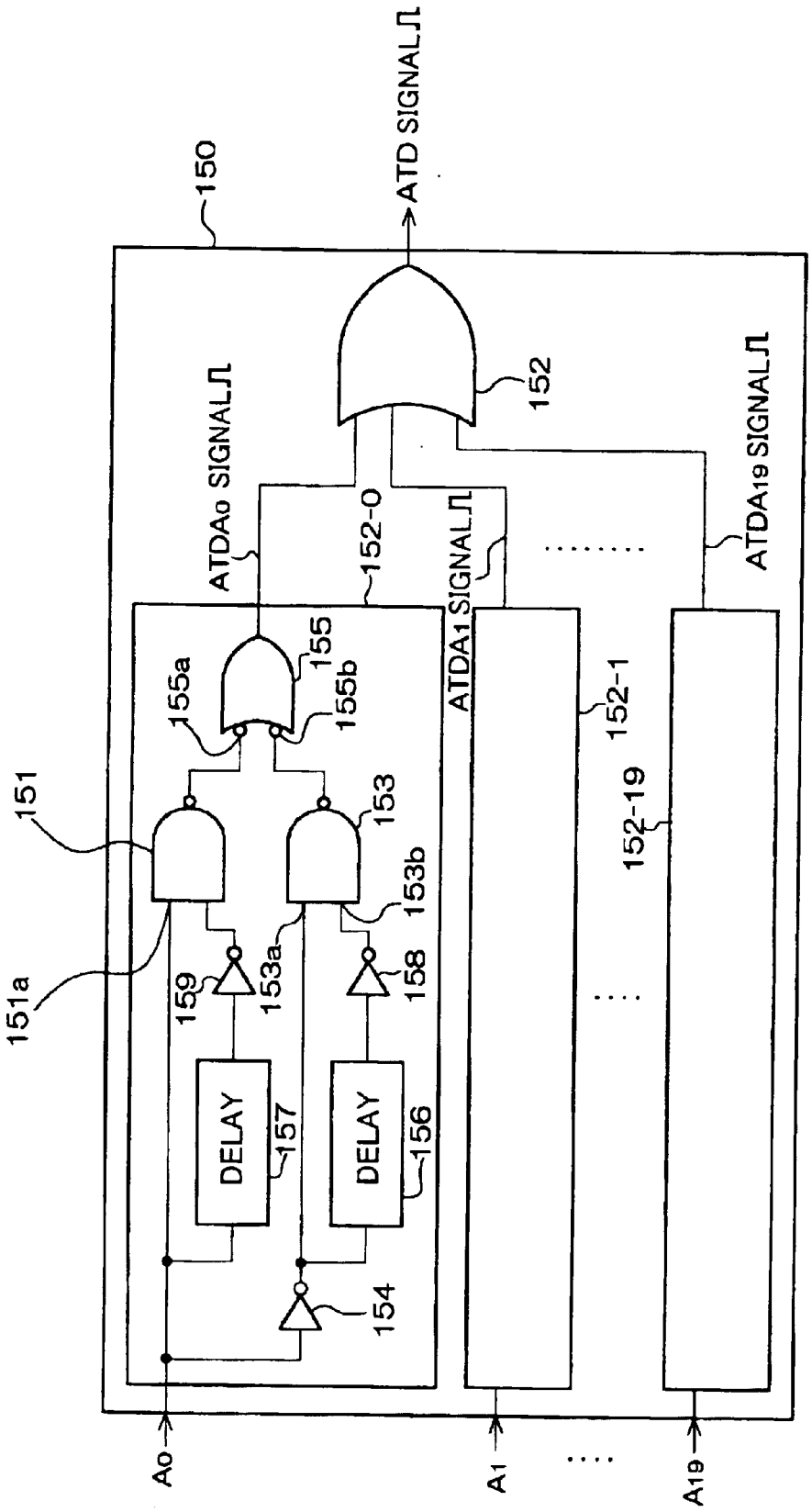
FIG. 4 is a circuit block diagram of an ATD signal generation circuit provided in the semiconductor device in accordance with this embodiment of the present invention.

The ATD signal generation circuit 150 will now be described in detail. A circuit block diagram of the ATD signal generation circuit 150 is shown in FIG. 4. As shown in FIG. 4, the ATD signal generation circuit 150 includes the same number of signal change detection sections 152-0 to 152-19 as the number of signals (block address signals, column address signals, and row address signal) $A_0$ to $A_{19}$, specifically twenty such sections. The corresponding signals $A_0$ to $A_{19}$ are input to the signal change detection sections 152-0 to 152-19 from the address buffer 60 (FIG. 1). A pulse-form ATD signal is output from the ATD signal generation circuit 150 when at least one of the signals $A_0$ to $A_{19}$ changes from L level to H level or from H level to L level, (in other words, when an address changes).

The circuit structures of the signal change detection sections 152-0 to 152-19 will now be described, using the signal change detection section 152-0 as an example. If the signal $A_0$ that is input to the signal change detection section 152-0 changes from H level to L level or from L level to H level, the signal change detection section 152-0 outputs a pulse-form $ATDA_0$ signal. Assume that the initial state of the signal $A_0$ was H level and the signal $A_0$ changes from H level to L level, by way of example.

The H-level signal $A_0$ is input to the signal change detection section 152-0. This H-level signal $A_0$ is input to an input terminal 151a of an NAND gate 151. This H-level signal $A_0$ passes through a delay circuit 157, is inverted by an inverter 159 to become a L-level signal, then is input to an input terminal 151b of the NAND gate 151. This causes the input of an H-level signal from the NAND gate 151 to an input terminal 155a of a NAND gate 155.

The above-described H-level signal $A_0$ is also inverted by a inverter 154 to become a L-level signal that is input to an input terminal 153a of a NAND gate 153. This H-level signal $A_0$ is also inverted by the inverter 154 to become a L-level signal, passes through a delay circuit 156, is inverted by an inverter 158 to become a H-level signal, then is input to an input terminal 153b of the NAND gate 153. This causes the input of a H-level signal from the NAND gate 153 to an input terminal 155b of the NAND gate 155.

Thus the signal that is output from the NAND gate 155 goes to L level and generates the $ATDA_0$ signal.

In the above-described state, assume that the signal $A_0$ changes from H level to L level, by way of example. The L-level signal $A_0$ causes the signal that is input to the input terminal 151a to go from H level to L level. The signal that is output from the NAND gate 151 remains at H level.

The above-described L-level signal $A_0$ also causes the signal that is input to the input terminal 153a to change from L level to H level. Since the delay circuit 156 is connected to the input terminal 153b, the signal that is input to the input terminal 153b is still at H level. This causes the signal that is output from the NAND gate 153 to change from H level to L level. The $ATDA_0$ signal is therefore output from the NAND gate 155 at H level.

The signal that is input to the input terminal 153b goes from H level to L level after a fixed period has elapsed. That is because the L-level $A_0$ signal is inverted by the inverter 154, passes through the delay circuit 156, is inverted again by the inverter 158, then is input to the input terminal 153b. The signal that is output from the NAND gate 153 goes from L level to H level because of the change from H level to L level of the signal that is input to the input terminal 153b. Thus the output of the $ATDA_0$ signal at H level halts after a fixed period has elapsed.

The circuitry of the signal change detection sections 152-1 to 152-19 has the same structure as that of the signal change detection section 152-0, so that the signal change detection sections 152-1 to 152-19 output pulse-form $ATDA_1$ to $ATDA_{19}$ signals when the corresponding signals $A_1$ to $A_{19}$ that are input thereto change from H level to L level or from L level to H level.

When at least one of the pulse-form $ATDA_0$ to $ATDA_{19}$ signals is generated, a pulse-form signal is output from the NOR gate 152. This signal becomes the pulse-form ATD signal that is output from the ATD signal generation circuit 150.

Block Select Signal Generation Circuit

Figure 5:
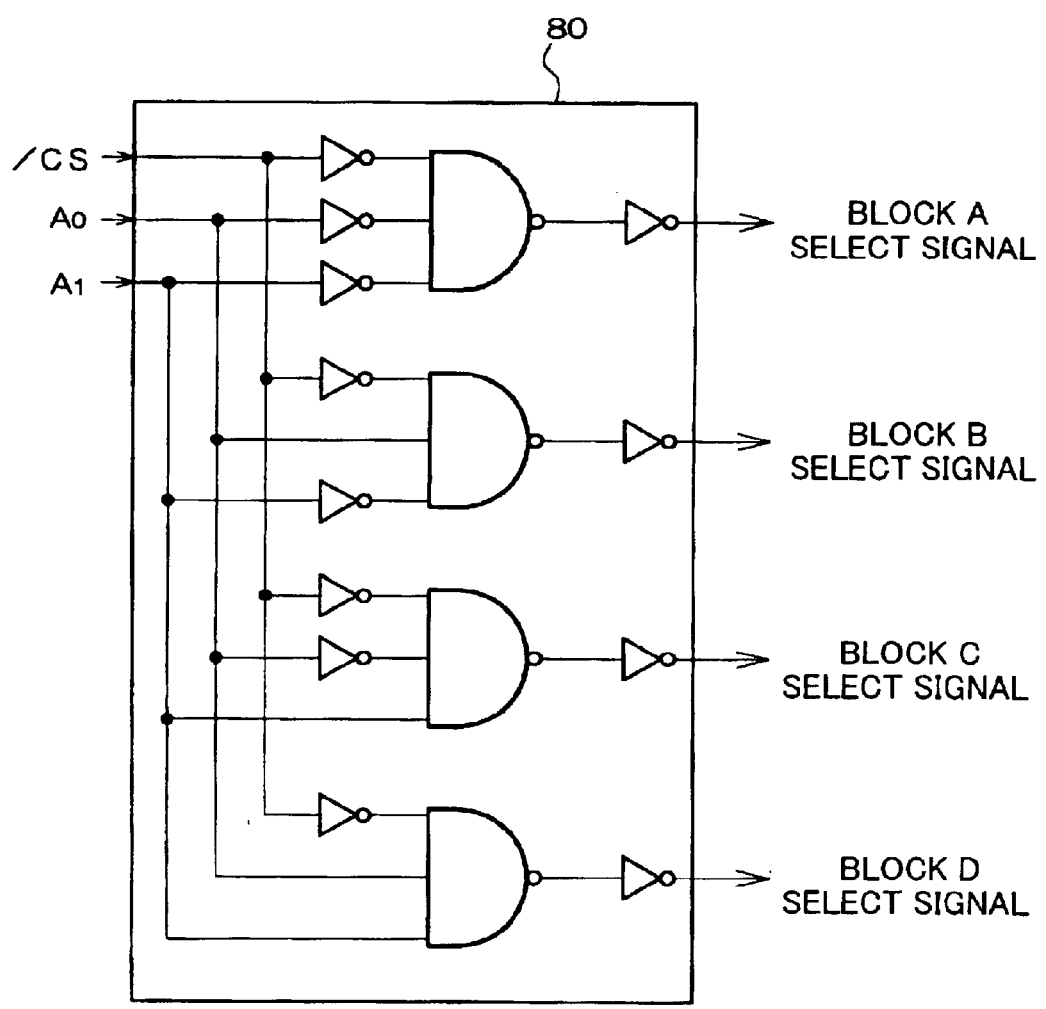
FIG. 5 is a circuit block diagram of a block select signal generation circuit provided in the semiconductor device in accordance with this embodiment of the present invention.

The block select signal generation circuit 80 is described below in detail with reference to FIG. 5. FIG. 5 is a circuit block diagram of the block selection signal generation circuit 80. The chip select signal/CS and the block address signals $A_0$ and $A_1$ are input to the block selection signal generation circuit 80. The block A to D select signals are output from the block selection signal generation circuit 80. The logic circuitry of the block selection signal generation circuit 80 is configured so that the following conditions (A) to (E) are satisfied:

(A) When the chip select signal/CS is at L level and the block address signals ($A_0$ and $A_1$) are (L level, L level), the block A select signal at H level (active) and also the block B select signal, the block C select signal, and the block D select signal at L level (non-active) are output from the block selection signal generation circuit 80.

(B) When the chip select signal/CS is at L level and the block address signals ($A_0$ and $A_1$) are (H level, L level), the block B select signal at H level (active) and also the block A select signal, the block C select signal, and the block D select signal at L level (non-active) are output from the block selection signal generation circuit 80.

(C) When the chip select signal/CS is at L level and the block address signals ($A_0$ and $A_1$) are (L level, H level), the block C select signal at H level (active) and also the block A select signal, the block B select signal, and the block D select signal at L level (non-active) are output from the block selection signal generation circuit 80.

(D) When the chip select signal/CS is at L level and the block address signals ($A_0$ and $A_1$) are (H level, H level), the block D select signal at H level (active) and also the block A select signal, the block B select signal, and the block C select signal at L level (non-active) are output from the block selection signal generation circuit 80.

(E) When the chip select signal/CS is at H level, the block A select signal, the block B select signal, the block C select signal, and the block D select signal at L level (non-active) are output from the block selection signal generation circuit 80.

Block Controllers

Figure 6:
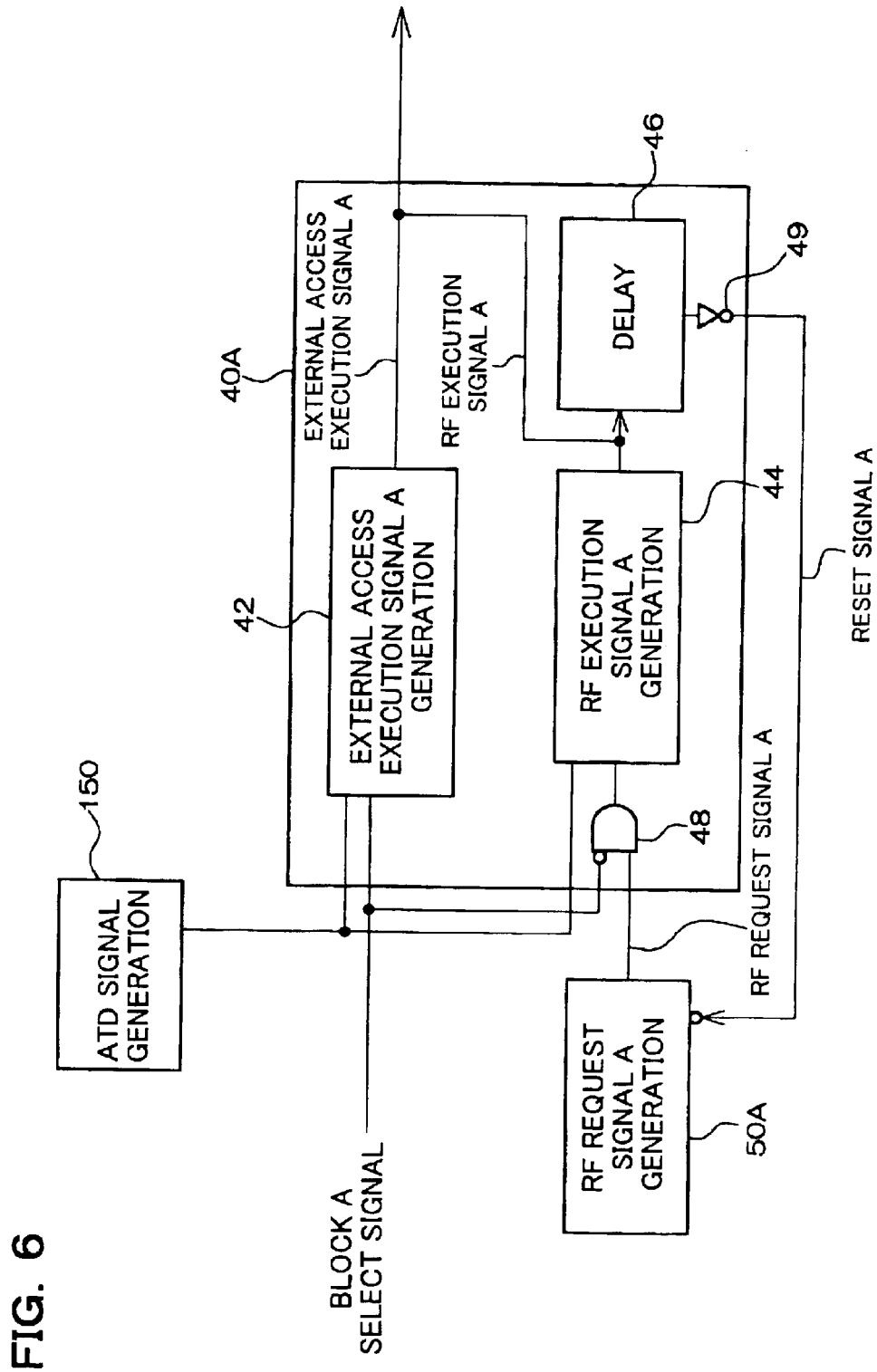
FIG. 6 is a circuit block diagram of a block controller and related circuitry provided in the semiconductor device in accordance with this embodiment of the present invention.

The block controllers are described below in detail, taking the block A controller 40A as an example. A circuit block diagram of the block A controller 40A and related circuits is shown in FIG. 6. The block A controller 40A includes an external access execution signal A generation circuit 42, an RF execution signal A generation circuit 44, a delay circuit 46, an AND gate 48, and an inverter 49.

The description below concerns the operations when the block A is selected (accessed externally). In this case, the block A select signal at H level (active) and the RF request signal A at H level (active) are input to the block A controller 40A.

This causes the block A select signal at H level and the RF request signal A at H level to be input to the AND gate 48. This causes a signal at L level to be output from the AND gate 48, and this L-level signal is input to the RF execution signal A generation circuit 44.

The block A select signal is also input at H level to the external access execution signal A generation circuit 42.

The ATD signal from the ATD signal generation circuit 150 is input to the external access execution signal A generation circuit 42 and the RF execution signal A generation circuit 44. Since the block A select signal is input at H level to the external access execution signal A generation circuit 42, the external access execution signal A is output at H level (active) is output from the external access execution signal A generation circuit 42 based on the ATD signal. Note that since the L-level signal from the AND gate 48 is input to the RF execution signal A generation circuit 44, the RF execution signal A is output at L level (non-active) from the RF execution signal A generation circuit 44. The external access execution signal A at H level becomes the output signal from the block A controller 40A.

The operations when the block A is not selected (is not being accessed externally) are described below. The block A select signal at L level (non-active) and the RF request signal A at H level (active) are input to the block A controller 40A.

This causes the block A select signal at L level and RF request signal A at H level to be input to the AND gate 48. This causes a signal at H level to be output from the AND gate 48, and this H-level signal is input to the RF execution signal A generation circuit 44.

The block A select signal at L level is also input to the external access execution signal A generation circuit 42.

The ATD signal from the ATD signal generation circuit 150 is input to the external access execution signal A generation circuit 42 and the RF execution signal A generation circuit 44. Since the H-level signal form the AND gate 48 is input to the RF execution signal A generation circuit 44, the RF execution signal A at H level (active) is output from the RF execution signal A generation circuit 44. Note that since the block A select signal at L level is input to the external access execution signal A generation circuit 42, the external access execution signal A at L level (non-active) is output from the external access execution signal A generation circuit 42. The RF execution signal A at H level (active) becomes the output signal from the block A controller 40A.

The RF execution signal A is also input to the delay circuit 46. Therefore, the RF execution signal A at H level is input to the delay circuit 46. The delay circuit 46 outputs a reset signal A at H level after the period of time needed for refreshing (such as 20 ns to 40 ns) has elapsed. This reset signal is inverted by the inverter 49 to become the reset signal A at L level, which is input to a reset (/R) of the RF request signal A generation circuit 50A. As a result, the RF request signal A goes to L level (non-active). This causes the RF execution signal A to go to L level (non-active), ending the refreshing.

The other block controllers have the same structure as that of the block A controller 40A and operate in the same manner. As described above, the generation of the H-level external access execution signal from one of the block controllers in this embodiment is synchronized with the generation of the H-level RF execution signals from all the remaining block controllers, based on the ATD signal in the operating state.

RF Request Signal Generation Circuits

Figure 7:
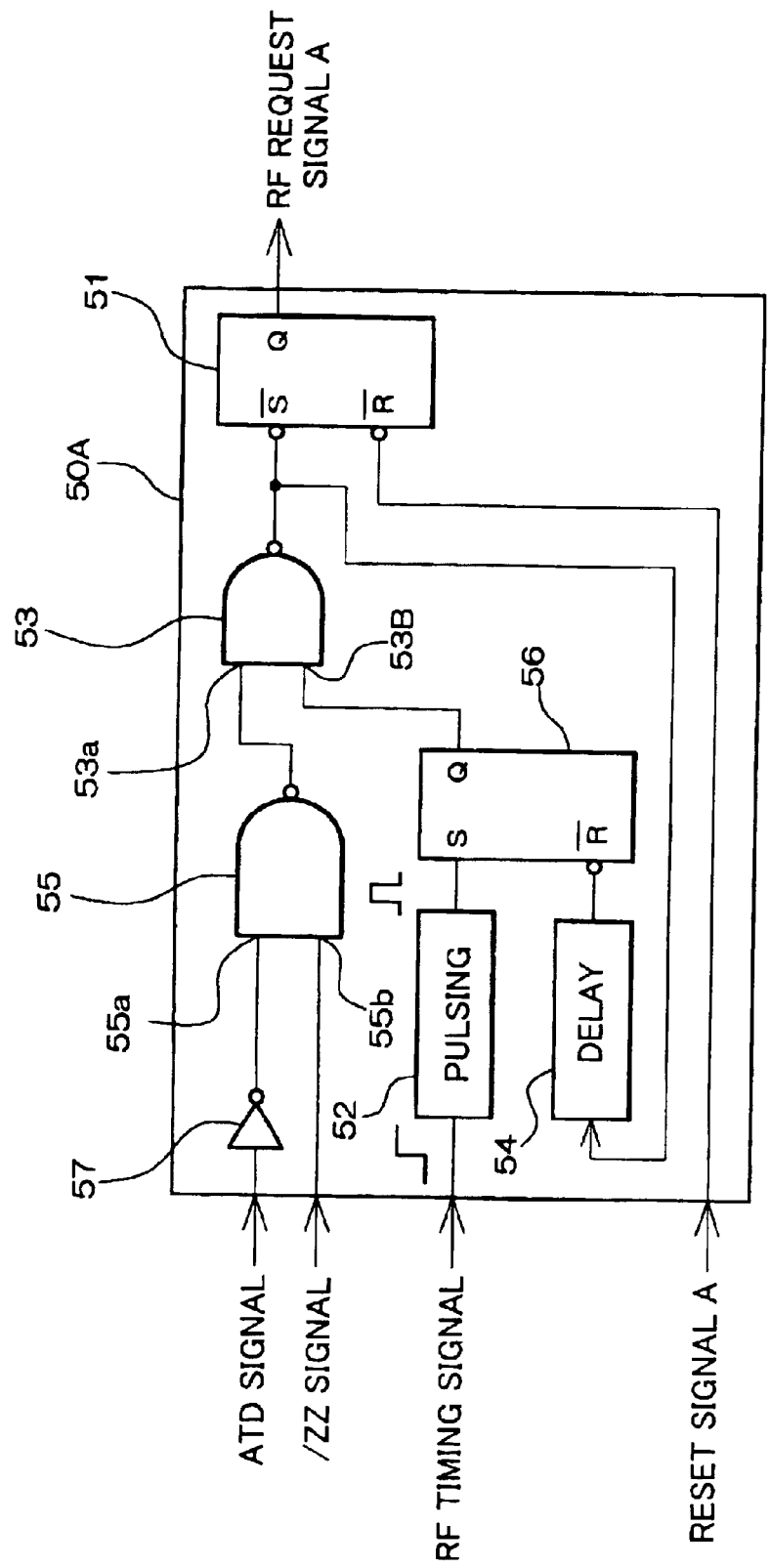
FIG. 7 is a circuit block diagram of an RF request signal generation circuit provided in the semiconductor device in accordance with this embodiment of the present invention.

The RF request signal generation circuits are described below, taking the RF request signal A generation circuit 50A as an example. A circuit block diagram of the RF request signal A generation circuit 50A is shown in FIG. 7. The ATD signal from the ATD signal generation circuit 150, the snooze signal/ZZ from the mode controller 110, the RF timing signal from the RF timing signal generation circuit 70, and the reset signal A from the block A controller 40A are input to the RF request signal A generation circuit 50A. The RF request signal A is also output from the RF request signal A generation circuit 50A. Specific details of the operation of the RF request signal A generation circuit 50A during the operating states are described below.

When a rising portion of the RF timing signal is input to a pulsing circuit 52, a H-level pulse signal is generated. When this pulse signal is input to an input S of a flip-flop 56, a signal at H level is output from an output Q of the flip-flop 56 and is input to an input terminal 53*b* of a NAND gate 53.

In the operating state of the semiconductor device 1, the snooze signal/ZZ at H level is input to an input terminal 55*b* of an NAND gate 55. When the ATD signal (H level) is input to the RF request signal A generation circuit 50A, the ATD signal (H level) is inverted by an inverter 57 to L level and that L-level signal is input to an input terminal 55*a* of the NAND gate 55. This causes the H-level signal that is output from the NAND gate 55 to be input to an input terminal 53*a* of the NAND gate 53.

Since signals at H level are input to the input terminals 53*a* and 53*b*, a signal at L level is output from the NAND gate 53 and this L-level signal is input to an input/S of a flip-flop 51. This causes the flip-flop 51 to be set, whereby a signal at H level is output from an output Q thereof. This signal becomes the RF request signal A at H level (active).

Note that since the L-level signal from the NAND gate 53 is also applied to an input/R of the flip-flop 56 through a delay circuit 54, a signal that is output from an output Q of the flip-flop 56 is at L level. The reason therefor is as follows: the RF request signal A goes to H level (active) when the ATD signal (H level) is input, although the rising portion of the RF timing signal is not input, even if the RF request signal A goes to L level (non-active) by causing the flip-flop 51 to be reset by the reset signal A.

Row Predecoders

Figure 8:
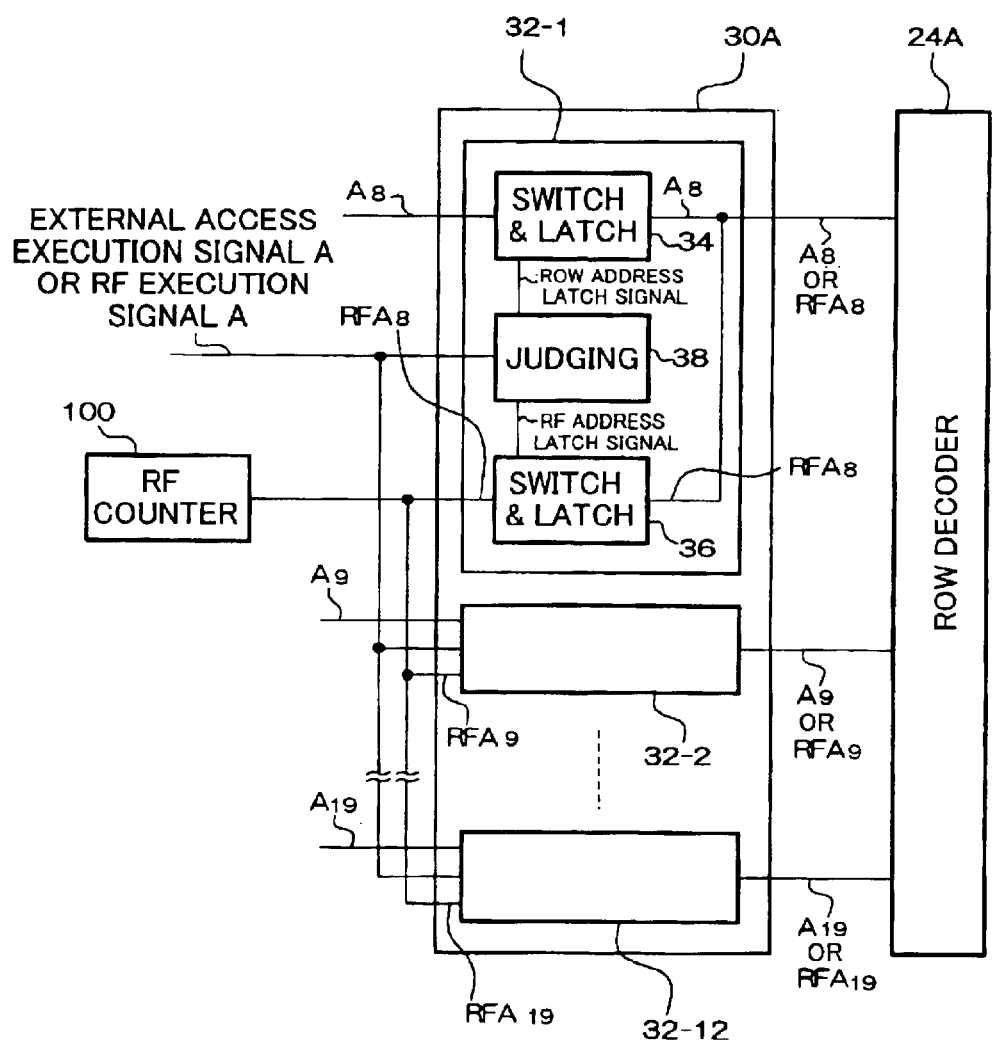
FIG. 8 is a circuit block diagram of a row predecoder and related circuitry provided in the semiconductor device in accordance with this embodiment of the present invention.

The row predecoders 30A to 30D are described below in detail, taking the row predecoder 30A as an example. A circuit block diagram of the row predecoder 30A and related circuits is shown in FIG. 8. The row predecoder 30A includes twelve selection sections 32-1 to 32-12 corresponding to the number of the row address signals $A_8$ to $A_{19}$. Each of the selection sections 32-1 to 32-12 selects a row address signal or refresh address signal.

Each of the selection sections 32-1 to 32-12 includes switch & latch circuits 34 and 36 and a judging circuit 38. A row address signal (the row address signal $A_8$ in the case of the selection section 32-1) is input to the switch & latch circuit 34. A refresh address signal (the refresh address signal $RFA_8$ in the case of the selection section 32-1) from the RF counter 100 is input to the switch & latch circuit 36.

A signal that is output from the block A controller 40A (FIG. 1), specifically either the external access execution signal A at H level or the RF execution signal A at H level, is input to the judging circuit 38. If the judging circuit 38 judges that the external access execution signal A at H level has been input thereto, the judging circuit 38 outputs a row address latch signal. Since this row address latch signal is input to the switch & latch circuit 34, the row address signal is latched by the switch & latch circuit 34 and is output therefrom. This causes the row predecoder 30A to output the row address signals $A_8$ to $A_{19}$. These are signals for driving the word line that selects the memory cell to be accessed externally. These drive signals are input to the row decoder 24A. The row decoder 24A selects the word line in the row to which the memory cell to be externally accessed belongs, based on these drive signals.

If the judging circuit 38 judges that the RF execution signal A at H level has been input thereto, on the other hand, the judging circuit 38 outputs an RF address latch signal. Since the RF address latch signal is input to the switch & latch circuit 36, it is latched by the switch & latch circuit 36 and is output therefrom. This causes the row predecoder 30A to output the refresh address signals $RFA_8$ to $RFA_{19}$. These are signals for driving the word line that selects the memory cell to be accessed externally. These drive signals are input to the row decoder 24A. The row decoder 24A selects the word line of the row to be refreshed, based on these drive signals.

The row predecoders 30B to 30D have the same structure as that of the row predecoder 30A and operate in the same manner.

RF Counter Controller

In this embodiment, refreshing is delayed in a block that is being accessed externally, as described in the section: "Refresh Operation of Semiconductor Device". In this embodiment, the RF counter controller 90 is provided to enable reliable refreshing of all the blocks A to D, as shown in FIG. 1.

The RF counter controller 90 generates the count-up signal after refreshing of the memory cells selected by the word line in the n-th row is completed in all of the blocks A to D. This causes the counter value of the RF counter 100 to be incremented by one, whereby the RF counter 100 outputs the refresh address signals $RFA_8$ to $RFA_{19}$ corresponding thereto. This output from the RF counter 100 causes the row predecoders 30A to 30D to supply signals for driving the word line in the (n+1) th row.

Figure 9:
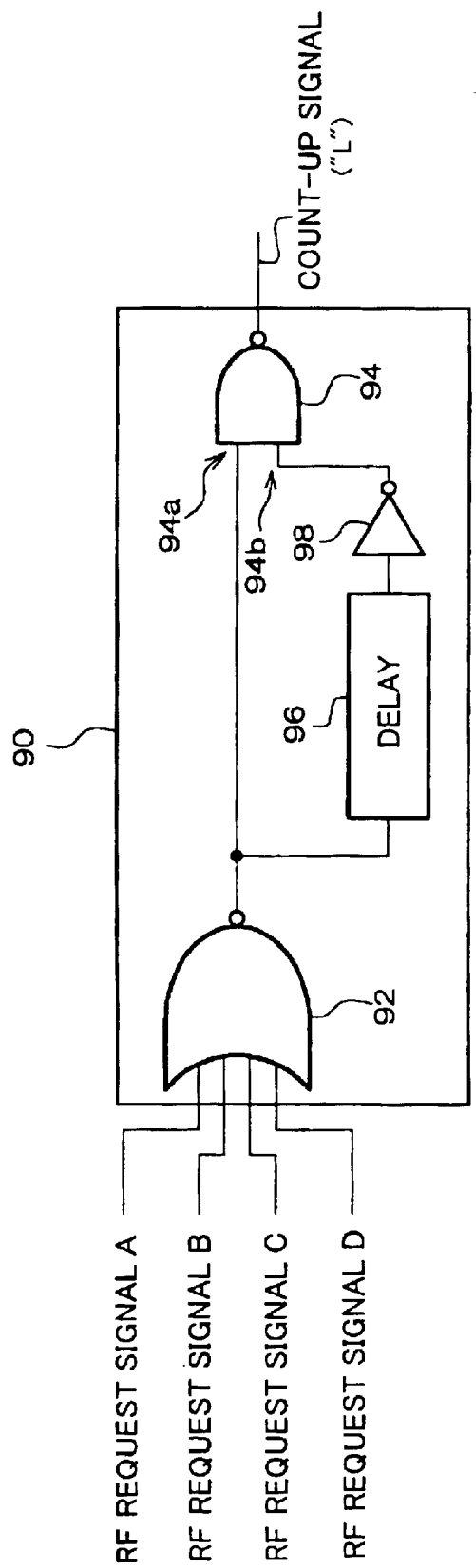
FIG. 9 is a circuit block diagram of an RF counter controller provided in the semiconductor device in accordance with this embodiment of the present invention.

A circuit block diagram of the RF counter controller 90 is shown in FIG. 9. The RF counter controller 90 includes a NOR gate 92, an NAND gate 94, a delay circuit 96, and an inverter 98.

The row predecoders 30A to 30D are input to the NOR gate 92. An output signal of the NOR gate 92 is input to the NAND gate 94. There are two paths for this signal. One path directly connects an output terminal of the NOR gate 92 to an input terminal 94*a* of the NAND gate 94. The other path connects the output terminal of the NOR gate 92 to an input terminal 94*b* of the NAND gate 94 through the delay circuit 96 and the inverter 98. An active-low count-up signal is output from the NAND gate 94.

Figure 10:
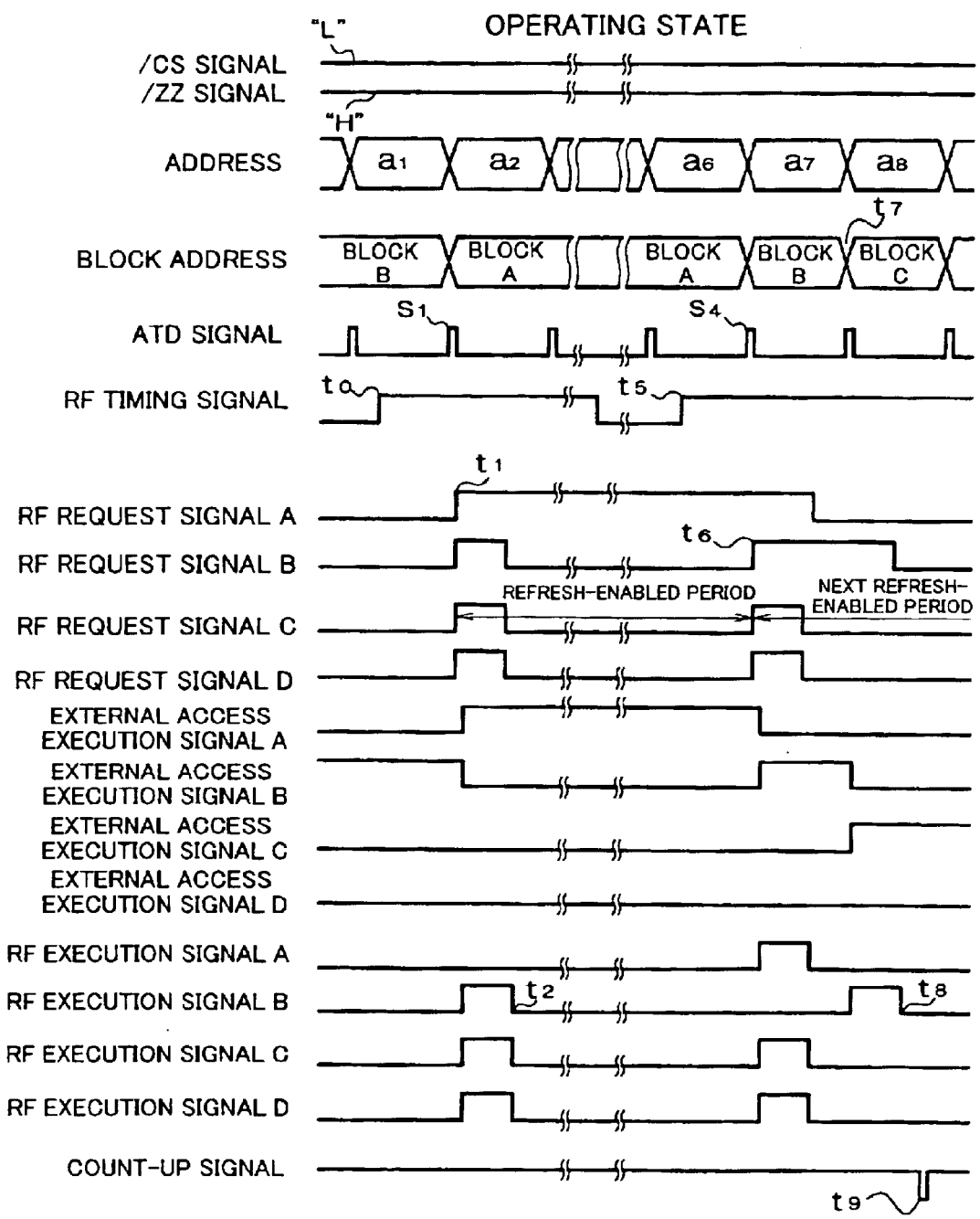
FIG. 10 is a timing chart of the operating state of the semiconductor device in accordance with this embodiment of the present invention during one period.

The mechanism that causes the RF counter controller 90 to output the count-up signal is described below with reference to FIGS. 1, 9, and 10. FIG. 10 is a timing chart of the semiconductor device 1 in the operating state during one time period. The chip select signal/CS is at L level, activating the operating state.

The operations of the semiconductor device 1 from time to $t_0$ time $t_2$ are the same as those from time $t_0$ to time $t_2$ in the timing chart of FIG. 2. Specifically, the memory cells selected by the word line in the n-th row are refreshed in the block B, the block C, and the block D.

After the RF timing signal next rises to H level (time $t_5$), the RF request signal B to D go to H level (time $t_6$) based on the generation of the first ATD signal ($s_4$).

A period from time $t_1$ to a time $t_6$ is a refresh-enabled period. Refreshing can be performed once in the blocks A to D during this period. Since the block A is selected continuously during this refresh-enabled period, the memory cells selected by the word line in the n-th row are not refreshed in the block A (refreshing is delayed by one refresh-enabled period). Therefore, since the RF request signal A remains at H level during this refresh-enabled period, the NOR gate 92 outputs an L-level signal. Since the NAND gate 94 outputs a H-level signal during this refresh-enabled period, the count-up signal is not generated.

Therefore, the memory cells in the same row in blocks A to D, specifically the memory cells selected by the word line in the n-th row, are refreshed during the next refresh-enabled period. To give more detail: since the block B is selected at time $t_6$, the external access execution signal B and the RF execution signals A, C, and D to H level. This causes refreshing of the memory cells selected by the word line in the n-th row in the blocks A, C, and D.

The block address is changed from the block B to the block C at a time $t_7$. Since the RF request signal B is at H level, the RF execution signal B goes to H level. This RF execution signal B causes refreshing of the memory cells selected by the word line in the n-th row in the block B. After a specific period of time has elapsed, the RF request signal B goes to L level. This causes the RF execution signal B to go to L level, ending there fresh (time $t_8$). This completes the refreshing of the memory cells selected by the word line in the n-th row in the blocks A to D.

Since all the RF request signals A to D are at L level at time $t_8$, an H-level signal is output from the NOR gate 92. This H-level signal is immediately input to the input terminal 94a of the NAND gate 94. Since an H-level signal is continuously input to the input terminal 94b, an active-low (L level) count-up signal is output from the NAND gate 94 (time $t_9$). Note that the H-level signal that is output from the NOR gate 92 passes through the delay circuit 96, is made to go to L level by the inverter 98, and is input to the input terminal 94b, so that the signal that is output from the NAND gate 94 immediately goes to H level.

The counter value of the RF counter 100 is incremented by one by the count-up signal and the RF counter 100 outputs the corresponding refresh address signal, specifically the address signal corresponding to the row which is to be refreshed next. This output from the RF counter 100 causes the row predecoders 30A to 30D, to which the refresh execution signals are input, to supply signals for refreshing the memory cells selected by the word line in the (n+1) th row, which are to be refreshed next.

As described above, this embodiment ensures that the memory cells selected by the word line in the (n+1) th row are not refreshed until the memory cells selected by the word line in the n-th row have been refreshed in all of the blocks A to D during one refresh-enabled period. This ensures that the memory cells in all the rows can be refreshed reliably.

If the RF counter controller 90 is provided, the refresh-enabled period must be determined from consideration of the refresh efficiency (the time period during which memory cells can hold data) and the number of refresh cycles (number of rows in each of the blocks A to D, specifically the number of word lines, which is 4096 in this embodiment). The refresh-enabled period is determined by the RF timing signal and the length of the refresh-enabled period is equal to the cycle of the RF timing signal. In other words, the cycle of the RF timing signal (the refresh-enabled period) is set to 50 μs under conditions such that the refresh efficiency is 200 ms and the number of refresh cycles is approximately 4000 (since the number of rows is 4096).

50 μs×4000=200 ms

Data cannot be held under these conditions if refreshing is delayed only once. The cycle of the RF timing signal (refresh-enabled period) is therefore set to 45 μs, by way of example.

45 μs×4000=180 ms (200 ms−180 ms)÷45 μs 444 times

Data can be held even if the refreshing is delayed up to 444 times, by setting the cycle of the RF timing signal (refresh-enabled period) to 45 μs.

As shown in FIG. 10, the memory cells connected to the word line in the n-th row in the block A are not refreshed during one refresh-enabled period (time $t_1$ to time $t_6$). In this embodiment, the memory cells connected to the word line in then-th row (same row) are refreshed in the next refresh-enabled period (time $t_6$ onward). However, the present invention is not limited thereto and the configuration could be such that the memory cells connected to the word line in the (n+1) th row are refreshed

EXAMPLE OF APPLICATION OF SEMICONDUCTOR DEVICE TO ELECTRONIC INSTRUMENT

Figure 11:
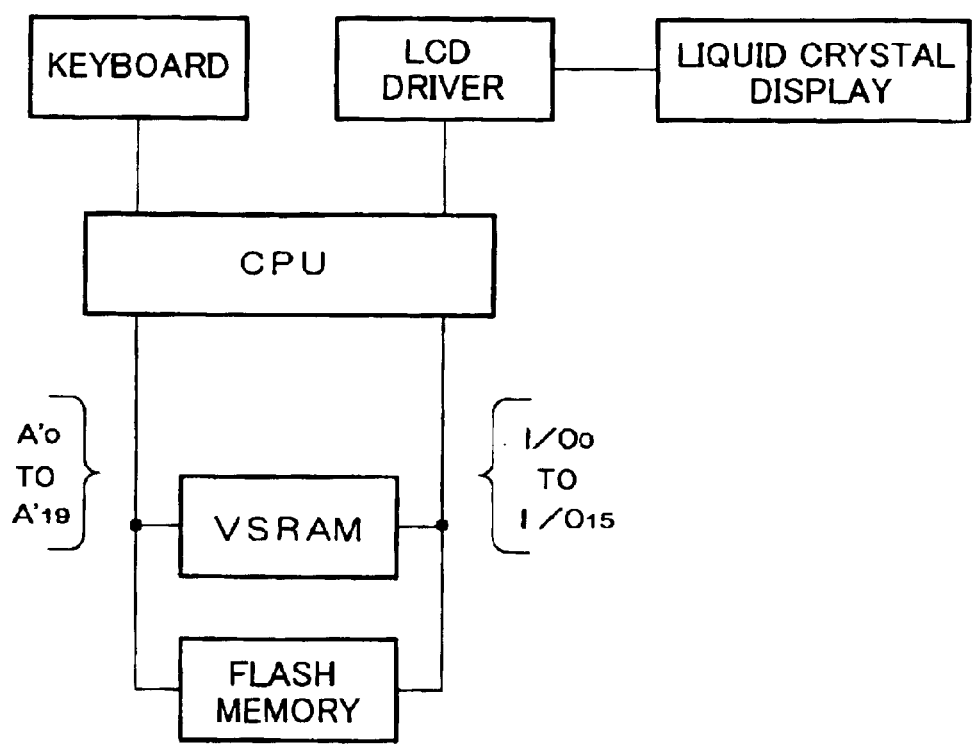
FIG. 11 is a partial block diagram of a portable telephone system that is provided with the semiconductor device in accordance with this embodiment of the present invention.

The semiconductor device 1 can be applied to an electronic instrument such as portable equipment. A block diagram of part of the system of a portable telephone is shown in FIG. 11. The semiconductor device 1 is a VSRAM. A CPU, the VSRAM, and flash memory are connected by bus lines for the address signals $A'_0$ to $A'_{19}$. The CPU, VSRAM, and flash memory are connected by bus lines for data signals $I/O_0$ to $I/O_{15}$. The CPU is connected to a keyboard and an LCD driver by the bus lines. The LCD driver is connected to a liquid crystal device section by the bus lines. The CPU, VSRAM, and flash memory make up a memory system.

Figure 12:
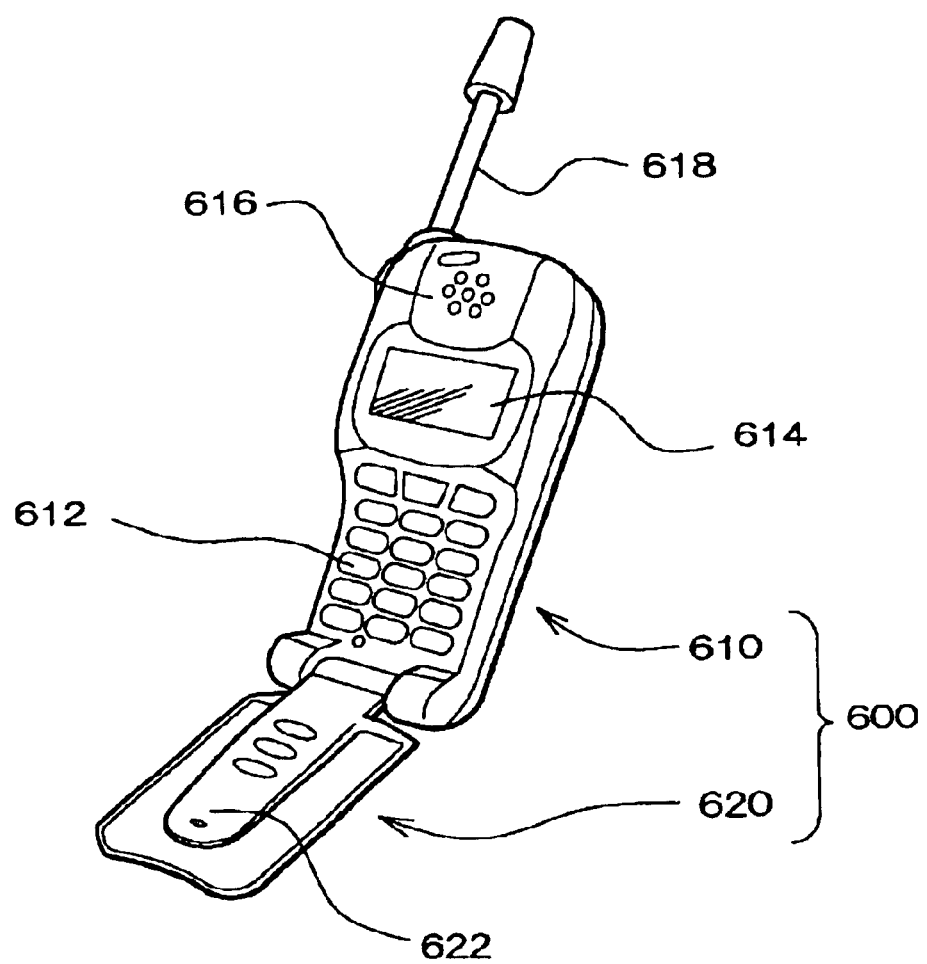
FIG. 12 is an oblique view of the portable telephone provided with the portable telephone system of FIG. 11.

FIG. 12 is an oblique view of a portable telephone 600 provided with the system for portable telephones shown in FIG. 11. The portable telephone 600 includes a keyboard 612, a liquid crystal display section 614, a body section comprising a receiver section 616 and an antenna section 618, and a cover 620 comprising a transmitter section 622.

What is claimed is:

1. A method of refreshing a semiconductor device having a memory cell array divided into a plurality of blocks, the method comprising:

an external access step of reading or writing data continuously with respect to a block selected from the plurality of blocks, by generating a plurality of addresses continuously by a pulse signal, based on one address specified by an address signal;

a detection signal generation step of generating a detection signal having a period longer than the pulse signal and detecting a change in the address signal; and a refreshing step of refreshing blocks in the plurality of blocks other than the selected block, based on the detection signal.

2. The method of refreshing a semiconductor device as defined in claim 1, wherein the refreshing step comprises:

a refresh request step of generating a refresh request with respect to each of the plurality of blocks, based on the detection signal; and a refresh execution step of refreshing blocks in the plurality of blocks other than the selected block, based on the refresh request.

3. The method of refreshing a semiconductor device as defined in claim 2, wherein the refresh execution step ends in a period between the generation of the detection signal and the generation of the next detection signal.

4. A semiconductor device comprising:

a memory cell array divided into a plurality of blocks;

a pulse signal generation circuit which generates a pulse signal;

a detection signal generation circuit which generates a detection signal having a period longer than the pulse signal and detecting a change in an address signal;

an address generation circuit which generates a plurality of addresses sequentially by the pulse signal, based on the one address specified by the address signal, so as to perform continuous reading or writing of data with respect to a block selected from the plurality of blocks; and a refresh circuit which refreshes blocks in the plurality of blocks other than the selected block, based on the detection signal.

5. The semiconductor device as defined in claim 4, wherein the address generation circuit comprises a column address generation circuit to which a column address signal out of the address signal is input, and which generates a plurality of column addresses by the pulse signal, based on the column address signal.

6. The semiconductor device as defined in claim 4, wherein the refresh circuit comprises:

a plurality of refresh request signal generation circuits each provided corresponding to each of the plurality of blocks, which generate refresh request signals with respect to the plurality of blocks, based on the detection signal; and a plurality of block controllers each provided corresponding to each of the plurality of blocks, wherein one of the plurality of block controllers, which corresponds to the selected block, generates an external access execution signal with respect to the selected block; and wherein remaining block controllers, which correspond to the blocks other than the selected block, generate refresh execution signals based on the refresh request signals.

7. A memory system comprising the semiconductor device as defined in claim 4.

8. An electronic instrument comprising the memory system as defined in claim 7.

* * * * *